US006165696A

United States Patent [19]

Fischer

[11] Patent Number: 6,165,696

[45] Date of Patent: Dec. 26, 2000

[54] PROCESS FOR APPLYING MARKS LETTERINGS AND STRUCTURES ON THE SURFACE OF AN IDENTITY CARD OR A DIFFERENT CARD

[75] Inventor: Dirk Fischer, Paderborn, Germany

[73] Assignee: Orga Kartensysteme GmbH, Paderborn, Germany

[21] Appl. No.: 08/977,967

[22] Filed: Nov. 25, 1997

[30] Foreign Application Priority Data

Nov. 28, 1996 [DE] Germany .......................... 196 49 301

[51] Int. Cl.[7] ................................................ G03F 7/20

[52] U.S. Cl. .......................... 430/320; 430/330; 430/945; 427/487; 427/500; 427/504; 427/511; 427/514

[58] Field of Search .................................... 430/320, 322, 430/311, 330, 945, 313; 427/487, 492, 496, 500, 504, 508, 510, 511, 514, 519

[56] References Cited

U.S. PATENT DOCUMENTS

| | | | |
|---|---|---|---|
| 4,370,397 | 1/1983 | Ceintrey et al. | 430/10 |
| 4,575,399 | 3/1986 | Tanaka et al. | 156/272.8 |
| 4,853,317 | 8/1989 | Hayes | 430/318 |
| 5,023,164 | 6/1991 | Brunsvold et al. | 430/270 |
| 5,302,491 | 4/1994 | Akylas et al. | 430/311 |
| 5,521,034 | 5/1996 | Hotta | 430/17 |

FOREIGN PATENT DOCUMENTS 0 202 803 11/1986 European Pat. Off. .

OTHER PUBLICATIONS

Frey, "Der Laser in der Obrflächentechnik" *Dunne Schiecten* pp. 20–24 (1968).

*Primary Examiner*—Kathleen Duda
*Attorney, Agent, or Firm*—Foley & Lardner

[57] ABSTRACT

A process for applying marks, letterings and/or structures on the surface of a card, comprising the steps of applying varnish that includes a photo-initiator and/or color printing ink that includes a photo-initiator on the surface of the card; and before the entire hardening of the varnish and/or the color printing ink, exposing the varnish and/or color printing ink in selected areas that define shapes of the marks, letterings and/or structures to ultraviolet light so that the degree of shine in the selected areas changes relative to surrounding areas.

47 Claims, 4 Drawing Sheets

PROCESS FOR APPLYING MARKS LETTERINGS AND STRUCTURES ON THE SURFACE OF AN IDENTITY CARD OR A DIFFERENT CARD

BACKGROUND OF THE INVENTION

The invention relates to a process for applying marks, letterings and structures on a surface, such as the surface of an identity card or other card.

The colours on identity cards, as for example chip cards (telephone-cards, magnetic cards, etc.), are applied by screen print or offset printing. They are dried or hardened by warmth, infra-red radiation or ultraviolet light applied to the entire area.

If it is desired to create writing, shades, structures, marbling, or symbols, it is necessary to use different colours and to dry those different colours either simultaneously or one after the other.

Lettering may be generated by engraving with a laser beam.

To date it has not been possible to produce writing, shades, structures, marbles, or symbols with definitely bordered regions which differ by different degrees of shine without using at least different nuances of color or even different colours.

SUMMARY OF THE INVENTION

It is an object of the present invention to provide a process whereby one can create regions on a surface, such as the surface of a card, which delimit from each other by different degrees of shine of one or more colours.

Briefly, the present invention comprises a process for applying marks, lettering and/or structures on a surface, such as the surface of an identity card or other card, comprising the steps of:

applying varnish that includes a photo-initiator and/or color printing ink that includes a photo-initiator on the surface of the card; and before the entire hardening of the varnish and/or the color printing ink, exposing the varnish and/or color printing ink in selected areas to define the shapes of the marks, letterings, and/or structures to ultraviolet light so that the degree of shine in the selected areas changes relative to surrounding areas.

In a further aspect of the present invention, the exposing step is carried out utilizing vacuum-ultraviolet light.

In a yet further aspect of the present invention, the exposing step comprises exposing with ultraviolet light consisting of monochromatic light.

In yet a further aspect of the present invention, the exposing step includes the step of achieving different degrees of shine by filtering polychromatic ultraviolet light with different wavelength filters for different selected areas and selectively exposing the card to the filtered light.

In yet a further aspect of the present invention, the process further comprises the step of hardening the varnish and/or color printing ink in the surrounding areas by infrared radiation or warmth.

In yet a further aspect of the present invention, the process includes the step of hardening the varnish and/or color printing ink in the surrounding areas by ultraviolet light whose wavelength is higher than the wavelength of the ultraviolet light used in exposing the selected areas.

In yet a further aspect of the present invention, the exposing step comprises the step of sending the ultraviolet light through a mask so that only certain regions of the card are exposed.

In a yet further aspect of the present invention, the exposing step comprises the step of steering the ultraviolet light on the surface of the card and achieving different degrees of shine by changing the deflection angle and/or changing the wavelength of the beam.

In a yet further aspect of the present invention, the exposing step comprises the step of steering the ultraviolet beam line by line on the surface of the card.

In a yet further aspect of the present invention, the exposing step comprises the step of steering the ultraviolet beam only to those points that create a desired contour.

In yet a further aspect of the present invention, the exposing step comprises the step of achieving different degrees of shine by changing the intensity of the ultraviolet beam.

In yet a further aspect of the present invention, a coated surface including a photo-initiator is provided having a first portion of the surface with a first shine characteristic, and having a second portion of the same color as said first portion, but with a different shine characteristic.

In a further aspect of the embodiment, the surface is coated with a composition including a monomer.

DETAILED DESCRIPTION OF THE PREFERRED EMBODIMENTS

The present invention comprises a process and an article for creating areas with a different degree of shine relative to surrounding areas on a surface such as, for example, a plastic coated card. The invention may be used to process any surface that can be made receptive to ultraviolet light. Preferred surfaces are ABS (Acrylonitrite/Butadiene/Styrene), PVC (Polyvinyl Chloride), PC (Polycarbonate), and PET (Polyethylene Terephthalate).

In accordance with the process of the present invention, initially varnish with a photo-initiator and/or colored printing ink with a photo-initiator is applied on a surface, such as a plastic card or a plastic-coated card. The term color printing ink is a broad term intended to encompass inks, paints, or any other substance that may be utilized to impart color to a card. The varnish or colored ink may comprise, by way of example, but not by way of limitation, a binder like a pre-polymer: polyester-acrylate, epoxy-acrylate, or silicone-acrylate; a monomer, such as a thinner which is capable of polymerization: polyetheracrylate or polyol-acrylate or polyester-acrylate; and a photo-initiator, like benzophenone. Note that a wide variety of photo-initiators may be utilized in place of benzophenon, such as, for example $\alpha$-hydroxyalkylphenone.

After application of the varnish or colored printing ink, selected areas of the not yet dried varnish or colored printing ink are exposed with ultraviolet light whereby the varnish or colored printing ink hardens at the exposed areas. It is believed the photo-initiator, when exposed to ultraviolet light, initiates the polymerization of the monomer so that the varnish/color ink starts to harden. It is further believed that the molecular structure of the photo-initiator changes when exposed to ultraviolet light.

The ultraviolet band that may be used is substantially in the range of 100 nm up to 300 nm. Although exposure times will vary with the material and the degree of shine differential desired, typical preferred exposure times are on the order of 10 ms up to 100 ms. The exposed areas then differ from the surrounding regions by a different degree of shine. Note that degree of shine describes whether a color looks more dull or more shiny.

The degree of shine is determined by the wavelength and/or the intensity of the ultraviolet beam and/or the exposure time. Accordingly, the degree of shine can be varied. The other areas not exposed to the ultraviolet beam are then hardened by warmth, infra-red radiation, or by ultraviolet light with a different wavelength and/or a different intensity and/or a different exposure time.

A variety of different options are available in order to expose selected areas with a prescribed wavelength and exposure time to obtain a desired degree of shine.

Figure 1:
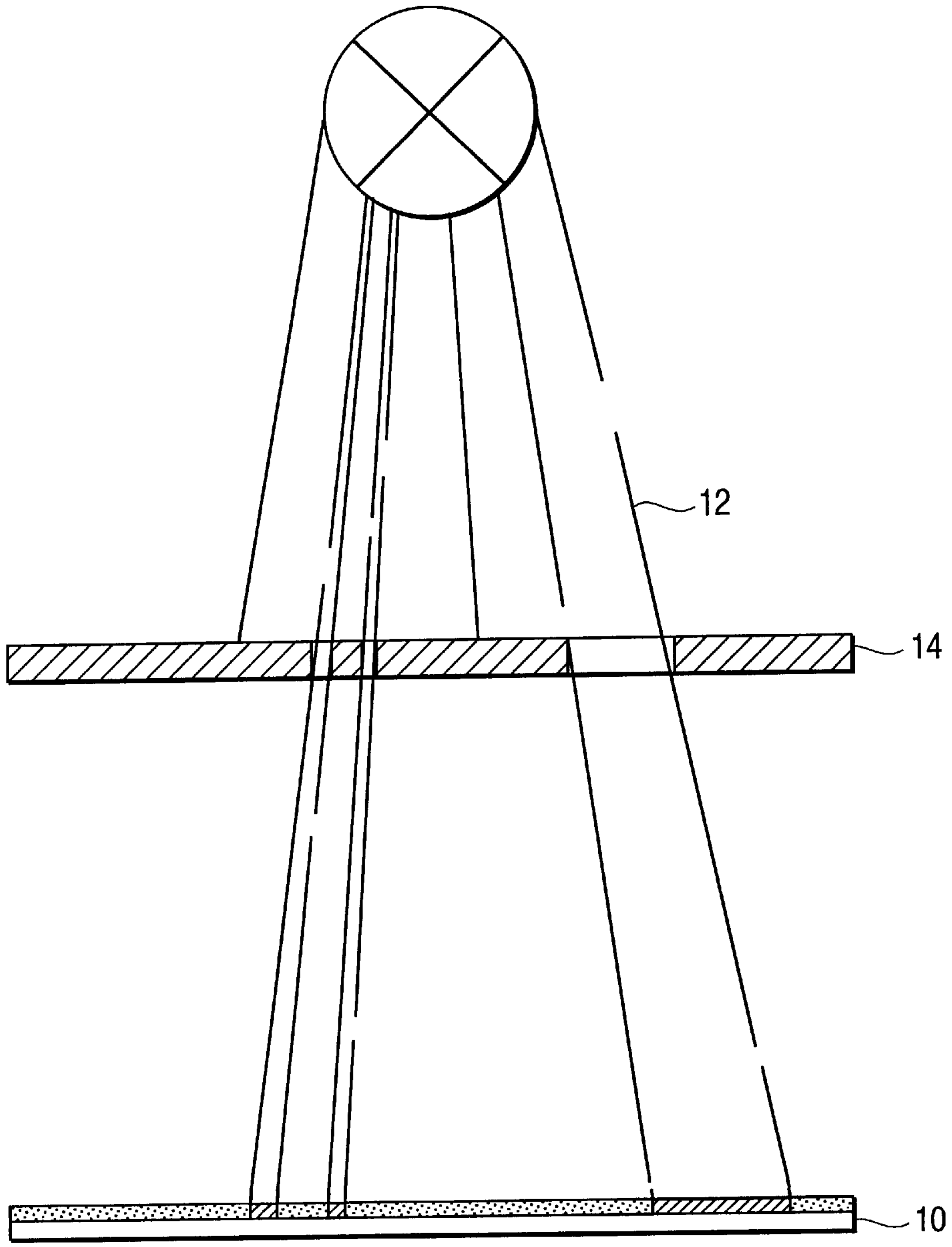
FIG. 1 is a schematic diagram illustrating a card being exposed through a mask.
Figure 2:
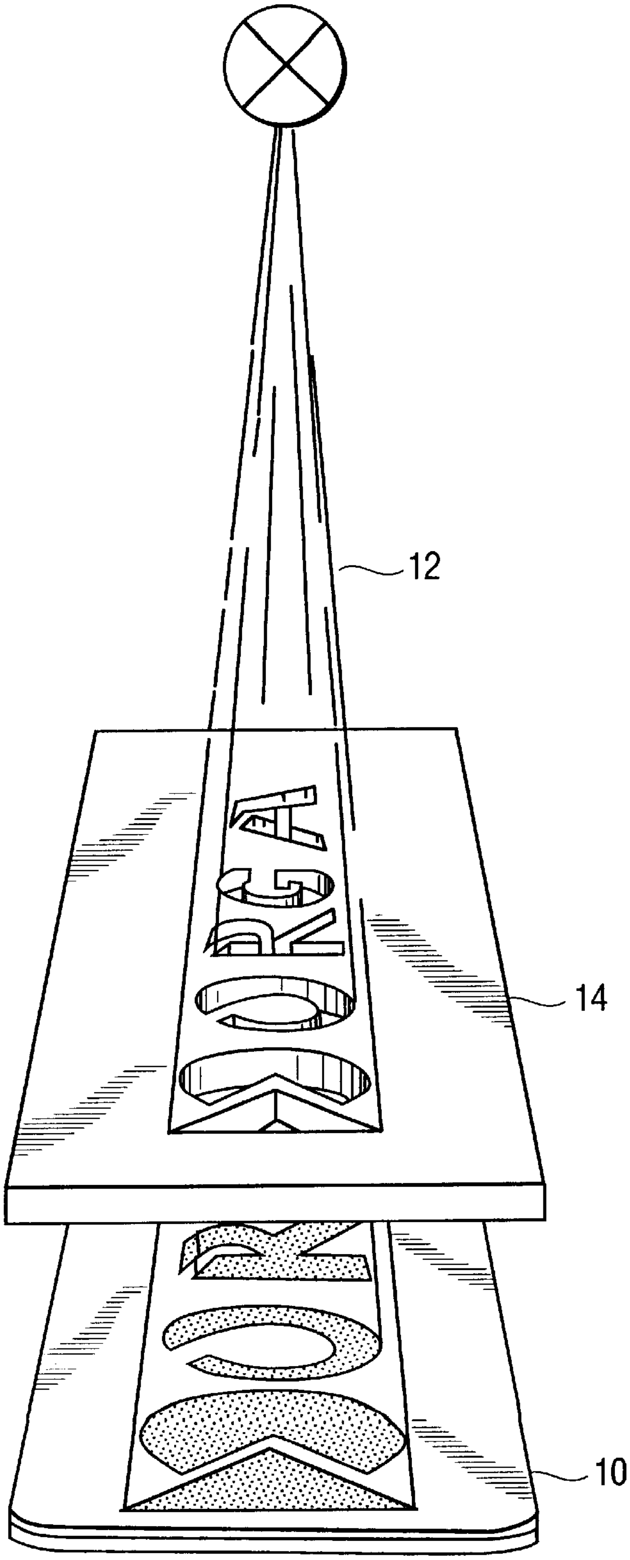
FIG. 2 is a schematic diagram illustrating a card being exposed through a different mask.

Referring to FIGS. 1 and 2, one possibility is to expose a card 10 with ultraviolet light 12 through openings in a mask 14.

Figure 3:
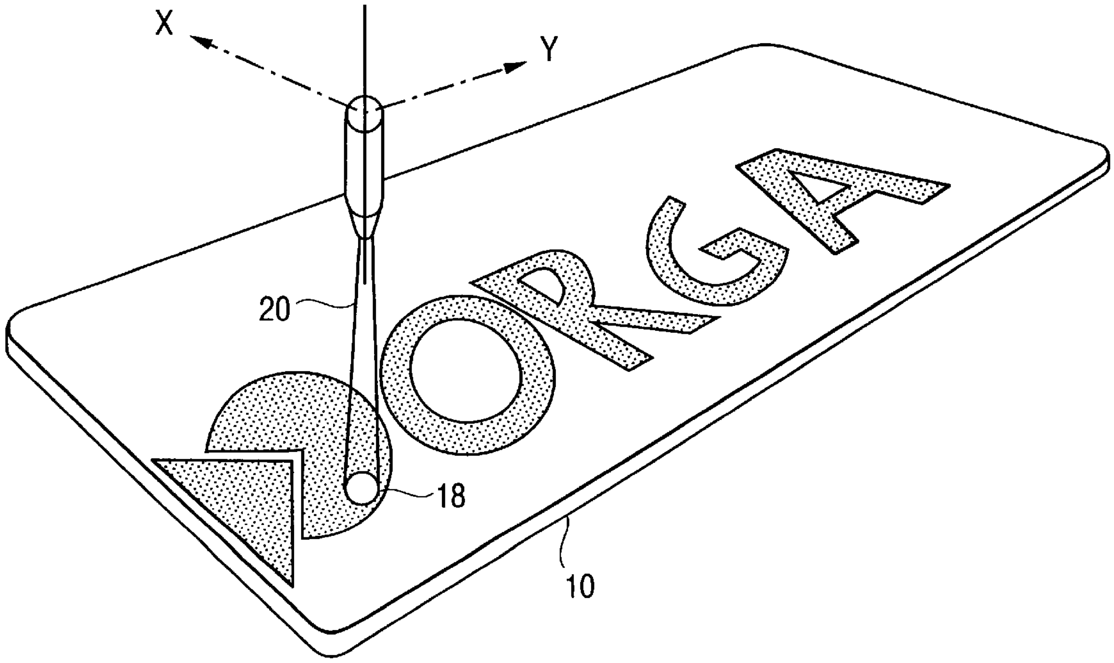
FIG. 3 is a schematic diagram showing a card being exposed by means of a narrow beam of ultraviolet light which is being steered.

Referring to FIG. 3, another possibility is to expose the selected areas 18 on the card 10 with a narrow ultraviolet beam 20 that may be controlled in a well-known manner to move on a preprogrammed path across the card. In this alternative, two methods are disclosed: the scanning method and the selection method.

With the scanning method a structure of different degrees of shine is created by causing the ultraviolet beam 20 to move in a similar manner to an oscilloscope, line by line on the surface of the card (similar to raster scanning). The generated degree of shine depends on the wavelength and the deflection-velocity (which directly relates to the exposure time) of the beam.

Alternatively, using the selection method only those points on the card are exposed which describe the intended shine contour. The other areas are hardened by warmth, infra-red radiation or by ultraviolet light with a higher wavelength.

The ultraviolet light utilized can be monochromatic (only one wavelength) or polychromatic (either a continuous spectrum or a bundle of single wavelengths).

Using polychromatic light one can change the degree of shine by mounting filters in front of the light source, which filters operate to extract certain wavelengths.

The strongest change of the degree of shine is achieved by the use of vacuum-ultraviolet light. Vacuum-ultraviolet light tends to have a shorter wavelength than normal ultraviolet light and thus has more energy. Vacuum-ultraviolet light can be generated by a standard Eximer-process. The selective use of vacuum-ultraviolet light for achieving different degrees of shine on the surface of a card is therefore exceptionally advantageous.

Figure 4:
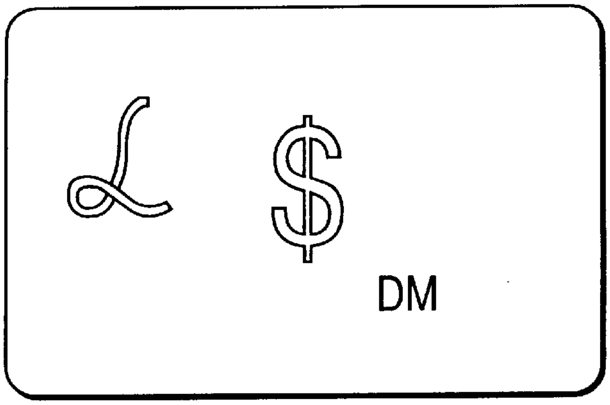
FIG. 4 is a representation of a card produced by the present inventive process to show symbols.
Figure 5:
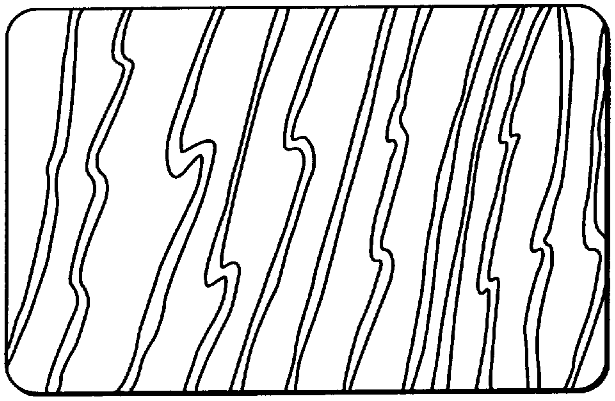
FIG. 5 is a representation of a card produced by the present inventive process to show marbling.
Figure 6:
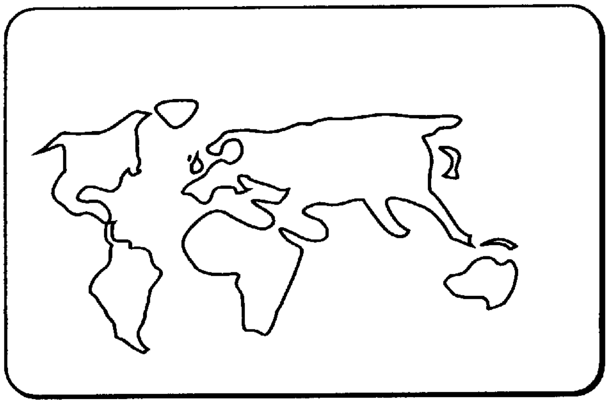
FIG. 6 is a representation of a card produced by the present inventive process to show a worldmap.

Several examples of cards produced by the inventive process are shown in FIGS. 4–6. FIG. 4 illustrates a card with symbols. FIG. 5 illustrates a card with marbling. FIG. 6 illustrates a card with a worldmap.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A process for applying visible marks, letterings and/or structures on a surface of an identity card, said identity card identifying by name and/or symbol, comprising the steps of:

applying a coating on the surface of the identity card, the coating selected from the group consisting of a varnish that includes a photo-initiator and a color printing ink that includes a photo-initiator; and before the entire hardening of the coating, exposing the coating in selected areas that define visible shapes of said marks, letterings and/or structures on the surface of the identity card to ultraviolet light so that the brightness of the reflection characteristics in said selected areas, referred to as the degree of shine in said selected areas, changes relative to surrounding areas.

2. A process according to claim 1, wherein said exposing step comprises the step of exposing with vacuum-ultraviolet light.

3. A process according to claim 2, wherein said exposing step comprises the step of exposing with vacuum-ultraviolet light consisting of monochromatic light.

4. A process according to claim 2, further comprising the step of hardening the coating in said surrounding areas by infra-red radiation or warmth.

5. A process according to claim 2, further comprising the step of hardening the coating in said surrounding areas by ultraviolet light whose wavelength is longer than the wavelength of said ultraviolet light used in said exposing step.

6. A process according to claim 2, wherein said exposing step comprises the step of directing said ultraviolet light through a mask so that only said selected areas of the identity card are exposed.

7. A process according to claim 2, wherein said exposing step comprises the step of moving an ultraviolet on the surface of the identity card and achieving different degrees of shine by changing the deflection-velocity and changing the wavelength of the beam.

8. A process according to claim 7, wherein said exposing step further comprises the step of moving the ultraviolet beam line by line on the surface of the identity card.

9. A process according to claim 7, wherein said exposing step further comprises the step of moving the ultraviolet only to those points that create a desired contour.

10. A process according to claim 2, wherein said exposing step comprises the step of achieving different degrees of shine by changing the intensity of said ultraviolet light.

11. A process according to claim 1, wherein said exposing step comprises the step of exposing with ultraviolet light consisting of monochromatic light.

12. A process according to claim 1, wherein said exposing step comprises the step of exposing with polychromatic ultraviolet light.

13. A process according to claim 1, wherein said exposing step comprises the step of exposing with polychromatic vacuum-ultraviolet light.

14. A process according to claim 1, wherein said exposing step includes the step of achieving different degrees of shine by filtering polychromatic ultraviolet light with different wavelength filters for different selected areas to produce filtered light and selectively exposing said identity card to said filtered light.

15. A process according to claim 14, further comprising the step of hardening the coating in said surrounding areas by infra-red radiation or warmth.

16. A process according to claim 14, further comprising the step of hardening the coating in said surrounding areas by ultraviolet light whose wavelength is longer than the wavelength of said ultraviolet light used in said exposing step.

17. A process according to claim 14, wherein said exposing step comprises the step of directing said ultraviolet light through a mask so that only said selected areas of the identity card are exposed.

18. A process according to claim 14, wherein said exposing step comprises the step of moving an ultraviolet beam on the surface of the identity card and achieving different degrees of shine by changing the deflection-velocity and changing the wavelength of the beam.

19. A process according to claim 18, wherein said exposing step further comprises the step of moving the ultraviolet beam line by line on the surface of the identity card.

20. A process according to claim 18, wherein said exposing step further comprises the step of moving the ultraviolet only to those points that create a desired contour.

21. A process according to claim 14, wherein said exposing step comprises the step of achieving different degrees of shine by changing the intensity of said ultraviolet light.

22. A process according to claim 1, wherein said exposing step includes the step of achieving different degrees of shine by filtering vacuum-polychromatic ultraviolet light with different wavelength filters for different selected areas to produce filtered light and selectively exposing said identity card to said filtered light.

23. A process according to claim 22, further comprising the step of hardening the coating in said surrounding areas by infra-red radiation or warmth.

24. A process according to claim 22, further comprising the step of hardening the coating in said surrounding areas by ultraviolet light whose wavelength is longer than the wavelength of said ultraviolet light used in said exposing step.

25. A process according to claim 22, wherein said exposing step comprises the step of directing said ultraviolet light through a mask so that only said selected areas of the identity card are exposed.

26. A process according to claim 22, wherein said exposing step comprises the step of moving an ultraviolet beam on the surface of the identity card and achieving different degrees of shine by changing the deflection-velocity and changing the wavelength of the beam.

27. A process according to claim 1, further comprising the step of hardening the coating in said surrounding areas by infra-red radiation or warmth.

28. A process according to claim 1, further comprising the step of hardening the coating in said surrounding areas by ultraviolet light whose wavelength is longer than the wavelength of said ultraviolet light used in said exposing step.

29. A process according to claim 1, wherein said exposing step includes the step of generating said ultraviolet light by an excimer spotlight.

30. A process according to claim 1, wherein said exposing step comprises the step of directing said ultraviolet light through a mask so that only said selected areas of the identity card are exposed.

31. A process according to claim 1, wherein said exposing step comprises the step of moving an ultraviolet on the surface of the identity card and achieving different degrees of shine by changing the deflection-velocity and changing the wavelength of the beam.

32. A process according to claim 31, wherein said exposing step further comprises the step of moving the ultraviolet beam line by line on the surface of the identity card.

33. A process according to claim 31, wherein said exposing step further comprises the step of moving the ultraviolet only to those points that create a desired contour.

34. A process according to claim 1, wherein said exposing step comprises the step of achieving different degrees of shine by changing the intensity of said ultraviolet light.

35. A process as defind in claim 1, wherein said coating step comprises the step of applying a coating that further includes a monomer.

36. A process as defined in claim 35, wherein said exposing step comprises the step of exposing with vacuum ultraviolet light.

37. A process according to claim 1, wherein said coating is present on the surface of the finished card.

38. A process according to claim 1, further comprising:

after the exposing step, hardening said surrounding areas by a second exposure to warmth, infrared radiation, or ultra-violet radiation with a longer wavelength than said ultraviolet light of said exposing step.

39. A process according to claim 1, wherein the coating is a varnish that includes a photo-initiator and is permanent.

40. A process according to claim 1, wherein said exposing step comprises:

before the entire hardening of the coating, exposing the coating in selected areas that define visible shapes of said marks, letterings and/or structures on the surface of the identity card to ultraviolet light for a predetermined period of time less than a total period of exposure for surrounding areas so that the brightness of the reflection characteristics in said selected areas, referred to as the degree of shine in said selected areas, changes relative to said surrounding areas.

41. The process according to claim 1, wherein said identity card is a chip card.

42. A process for applying visible marks, letterings and/or structures on a surface of an identity card, said identity card identifying by name and/or symbol, comprising the steps of:

applying a coating on the surface of an identity card, wherein said coating is selected from the group consisting of a varnish that includes a photo-initiator and a color printing ink that includes a photo-initiator;

selectively exposing the coating to ultraviolet light in selected areas to define visible shapes of the marks, letterings and/or structures on the surface of the identity card for a predetermined time period during a first exposure of ultraviolet light so that the brightness of the reflection characteristics in said selected areas, referred to as a degree of shine, changes relative to surrounding areas that are not selectively exposed during said first exposure, wherein said selectively exposing step is performed before an entire hardening of said coating; and hardening said surrounding areas by a second exposure to warmth, infrared radiation, or ultra-violet radiation with a higher wavelength than said first exposure.

43. The process of claim 42, wherein the coating is selected from the group consisting of binders, monomers, and photo-initiators.

44. The process of claim 43, wherein said coating comprises a binder that is selected from the group consisting of polyester-acrylate, epoxy-acrylate, and silicone acrylate.

45. The process of claim 43, wherein said coating comprises a monomer that is selected from the group consisting of polyether-acrylate, and polyol-acrylate.

46. The process of claim 43, wherein said coating comprises a benzophenone photo-initiator.

47. A process for applying visible marks, letterings and/or structures on a surface of a plastic or plastic-coated card, comprising the steps of:

applying a coating on the surface of the plastic or plastic-coated card, the coating selected from the group consisting of a varnish that includes a photo-initiator and a color printing ink that includes a photo-initiator; and before the entire hardening of the coating, exposing the coating in selected areas that define visible shapes of said marks, letterings and/or structures on the surface of the plastic or plastic-coated card to ultraviolet light so that the brightness of the reflection characteristics in said selected areas, changes relative to surrounding areas.

* * * * *